United States Patent [19]
Wenzel et al.

[11] Patent Number: 5,623,148
[45] Date of Patent: Apr. 22, 1997

[54] DEVICE FOR THE GENERATION OF ELECTRON BEAMS

[75] Inventors: Bernd-Dieter Wenzel; Wolfgang Erbkamm; Olaf Gawer, all of Dresden, Germany

[73] Assignee: von Ardenne Anlagentechnik GmbH, Dresden, Germany

[21] Appl. No.: 570,185

[22] Filed: Dec. 11, 1995

[30]     Foreign Application Priority Data

Dec. 9, 1994  [DE]  Germany .......................... 44 43 830.3

[51] Int. Cl.⁶ ........................ H01J 37/075; H01J 37/065
[52] U.S. Cl. ...................... 250/427; 219/121.27; 313/146
[58] Field of Search ............................... 250/423 R, 427;
                                                   219/121.27; 313/146

[56]                     References Cited

U.S. PATENT DOCUMENTS 3,182,175  5/1965  Sibley ............................. 219/121.27
  4,665,297  5/1987  Schiller et al. .................. 219/121.27
  4,952,802  8/1990  Duryea ................................ 313/146

*Primary Examiner*—Jack I. Berman
*Attorney, Agent, or Firm*—Nolte, Nolte and Hunter, P.C.

[57]                        ABSTRACT

The invention which relates to a device for the generating of electron beams with a vacuum chamber, in which a massive cathode (10) is arranged with a wire cathode (14) arranged above and a aperture anode (17) below the massive cathode (10) and whom below the aperture anode (17) focusing and/or deflecting magnet arrangements are provided which direct an electron beam (23) emitted by the massive cathode (10) and accelerated by the aperture anode (17) to a processing location (22), has the basic task to make the power of such devices variable over a large range using simple mechanical means. According to the invention the task is solved by arranging the aperture anode (17) rigidly and the massive cathode (10) and the wire cathode (14) axially movable within the vacuum chamber (1). For the movements of the massive cathode (10) and the wire cathode (14) contact means are provided which follow their movements and lead to the outside of the vacuum chamber (1). In addition for the axial movement of the massive cathode (10) a motion means is provided connected with the cathode (Figure).

12 Claims, 1 Drawing Sheet

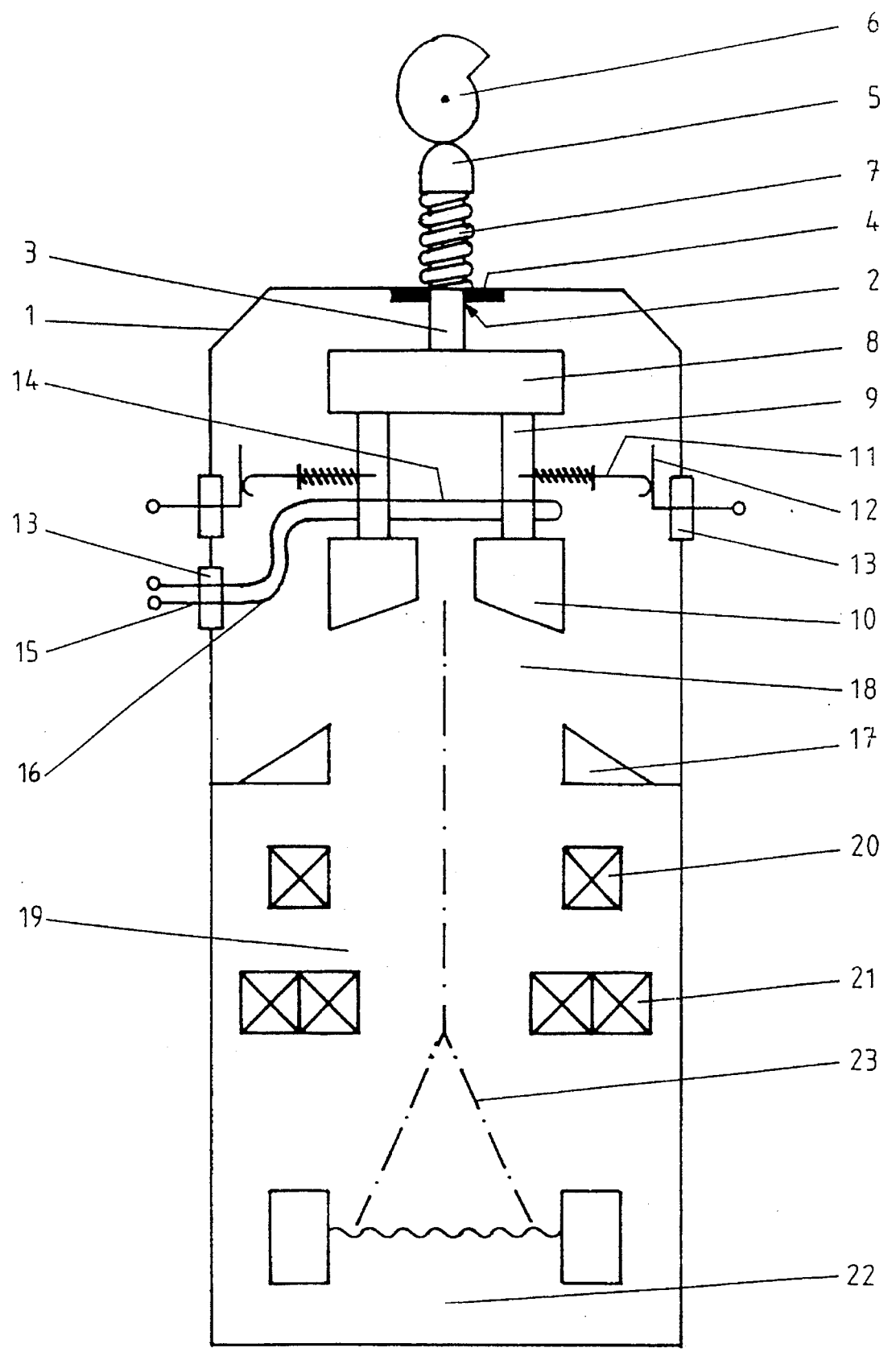

DEVICE FOR THE GENERATION OF ELECTRON BEAMS

BACKGROUND OF THE INVENTION

The invention relates to a device for the generation of electron beams in a vacuum chamber, in which a massive cathode with a filament anode positioned above, is arranged, below the massive cathode an anode with an aperture is positioned and below the anode with the aperture magnet arrangements are provided for focusing and/or deflecting an electron beam emitted from the massive cathode and accelerated by the aperture anode and directing it to a processing location.

Devices of the type mentioned above are known as so-called electron guns. These are generators of electron beams with a high electric power and a high pressure-decoupling between a chamber for the generation of beams and a processing chamber by stream resistances arranged in the electron gun.

Within such electron guns a massive cathode is provided. Above the massive cathode a spiral heating filament is located which is denoted as a wire cathode. Between the wire cathode and the massive cathode an auxiliary voltage of about 1000 V is applied ( a so-called shock potential). As a result the electrons emitted by the wire cathode move to the massive cathode, impinge there and heat it. The massive cathode thereupon itself emits electrons which are accelerated by an anode arranged below the massive cathode and leave as an electron beam the electrode arrangement through the aperture of the aperture anode. This electron beam is being focused by magnet arrangements and can be deflected by additional magnet arrangements. The electron beam impinges on a workpiece and heats it with a high efficiency.

Such electron guns are used in vacuum apparatus for heating, melting, and vaporizing when powers of about 50 kilowatt to several megawatt are required. These installations are manufactured with different power stages so that the required power can be reached. The individual matching of the power is done by regulating the power of each electron gun. Basically there are known three ways to accomplish this:

A first possibility is to vary the electron stream by changing the temperature of the cathode. A disadvantage of this is that on the one hand ,because of the great mass of the massive cathode, this change is relatively sluggish. On the other hand the diameter of the beam is increased, leading to a power loss of the beam on the way to the processing location because of high scattering losses. In addition only a small control range of the power in a ratio 1:3 can be achieved.

A second possibility for varying the power is by changing the accelerating voltage between the aperture anode and the massive cathode. The disadvantage of this is that when reducing the accelerating voltage the energy of the particles is reduced leading to a so-called weak beam. This beam is associated with high losses. A further disadvantage is that at such power changes the magnetic fields of the focusing lenses and the beam deflection of the electron beam and eventually also the magnetic fields of additional deflection fields have to be readjusted into the processing space.

A third possibility is to vary the field intensity between cathode and anode by adjusting the position of the aperture anode. Here a so-called position-regulated anode is known. This, for instance is described in the DD-economical patent 134 160. Hereby the position of the aperture anode in relation to the fixed massive cathode is varied. The apparent disadvantage of this is that also only a relatively small control range of the power in a ratio of 7:1 can be achieved. As a rule, however, a considerably greater control range is required. The control range is limited by the adjusting devices, which, because of the aperture in the middle of the aperture anode, can not engage at he center. For this reason the beam voltage has additionally to be varied so that the disadvantages of the second possibility show up.

SUMMARY OF THE INVENTION

The basic task of the invention is, therefore, to make the power of electron guns variable over a large range using simple mechanical means.

According to the invention this task is solved in such a way that the aperture anode is arranged in a fixed position inside the vacuum chamber while the massive cathode and the wire cathode are arranged axially movable. Hereby means of contact are provided over the path of motion of the massive cathode and the wire cathode which follow the movement of the cathodes and are lead outside the vacuum chamber. Furthermore a motion mechanism connected with the massive cathode is provided for producing the axial movement of the massive cathode.

This arrangement makes it possible to move the massive cathode within a wide range relative to the aperture anode and thus achieve a power variation which lies far above the ratio 1:7.

Because of the axial movement of the massive cathode the motion mechanism can be constructed mechanically relatively simple so that the manufacturing cost are reduced and the operationability is improved.

In an especially favorable embodiment of the invention it is arranged that the motion device is movable in the center axis of the massive cathode and is connected centrally with the massive cathode.

By such an arrangement an especially simple construction is obtained.

While it is principally possible to house the, motion device inside the vacuum chamber, in an especially favorable embodiment it is arranged that the motion device penetrates the vacuum chamber sealed to the outside This has the advantage that at least the driving mechanisms of the motion device is located outside the vacuum chamber and can therefore be serviced without any problems and in addition can not contaminate the process.

In a preferred embodiment of the invention it is provided that the motion device comprises an insulated rod movable in axial direction. On one end the rod supports the massive cathode and on the other end it is, penetrating the vacuum chamber, connected with a linear drive.

In this embodiment it is possible to arrange the drive outside the vacuum chamber and thus move the massive cathode over a wide range.

In an advantageous further development of the invention an insulating body is provided which on its underside is furnished with rods. At the lower end of the rods the massive cathode is arranged. The insulating body is on its upper side connected with the axially movable rod. At the places where the rod penetrates the vacuum chamber seals are provided sealing the penetration area of the rod, at its free end the rod attaches to a linear drive.

This further development makes it possible to manufacture the rod from conventional material because the insulating effect is taken over by the insulating body.

In a further advantageous embodiment of the invention a cam disk is provided with rotating drive. Hereby the rod is spring loaded pressed against the curved sector of the cam disk.

This makes it possible that by a simple rotating movement of the cam disk the massive cathode can be moved axially.. By means of the cam disk a quite accurate adjustment of the distance of the massive cathode from the aperture anode can be achieved. This produces a very advantageous realization of a linear drive.

Hereby it is possible to provide the rod with a collar. A compression spring is then arranged between the topside of the vacuum chamber and the collar. The compression spring is supported between the topside and the collar and presses the rod against the curved sector of the cam disk.

By such an arrangement it can be accomplished that there is always a close linkage between the curved section and the rod and thereby a longitudinal movement without play is made possible.

Another possibility for the realization of a linear drive is to arrange outside the vacuum chamber a spindle-nut drive as linear drive whereby the linearly movable part of this drive is connected non-rotationally with the rod. Hereby it is unimportant whether the nut with a rotating spindle or the spindle with a a rotating nut produces the longitudinal movement.

Spindle-nut-drives are the most used form of linear drives and can be utilized for this application in accordance with the invention, when large movements, between the massive cathode and the aperture anode have to be achieved.

In a further development of the invention it is provided that spring loaded contacts which slide longitudinally are at least indirectly connected to the massive cathode. These contacts attach to contact bars which are rigidly connected to the vacuum chamber.

Such an arrangement of the contacts makes it possible that the massive cathode can be loaded with cathode voltage over the whole path of motion.

A further possibility for supplying voltage to the massive cathode is to arrange inside the vacuum chamber fixed connecting elements, which are connected at least indirectly through flexible conduits to the massive cathode.

BRIEF DESCRIPTION OF THE DRAWING

In the following an exemplified embodiment explains the invention in more detail. The associated drawing shows a diagrammatic sketch of the apparatus according to the invention.

DESCRIPTION OF THE PREFERRED EMBODIMENT

In the upper side of a vacuum chamber 1 an opening 2 is located. A rod 3 penetrates this opening 2. Around the opening 2 a seal 4 is provided which seals the vacuum chamber 1 against the rod 3. At its upper end the rod 3 is provided with a collar 5 the upper section of which has a convex form.

Above the convex part of the collar 5 a rotating cam disk 6 is located which touches the convex part of the collar 5. Between the upper side of the vacuum chamber 1 and the collar 5 a compression spring 7 is arranged, which presses the convex part of the collar 5 against the curved sector of the cam disk 6. A rotation of the cam disk 6 moves, therefore, the rod 3 in a longitudinal direction.

At its lower end the rod 3 is connected with an insulator 8. This insulator 8 has at its underside rods 9. These rods 9 serve as holding fixtures for the massive cathode 10. The rods 9 are electrically conductive connected with the massive cathode 10. They are provided with spring loaded sliding contacts 11. In the wall of the vacuum chamber 1 contact bars 12 are rigidly installed. To insulate the contact bars 12 electrically from the vacuum chamber 1 they are embedded in insulators 13.

Above the massive cathode 10 a wire cathode 14 is provided. This wire cathode moves together with the massive cathode 10. To provide movability the wire cathode 14 is connected through a flexible conduit 16 with the fixed connection contacts 15 which are also embedded in an insulator 13.

Below the massive cathode 10 an aperture anode 17 is rigidly connected with the vacuum chamber 1. By this aperture anode 17, which is placed at massive potential, the beam generating chamber 18 is separated from the processing chamber 19. Between the beam generating chamber 18 and the processing chamber 19 stream resistance is required, which is realized by the magnet arrangements 20. Across these magnet arrangements 20 the beam can be focused and across the magnet arrangements 21 deflected. By the deflection it is achieved that at the processing location 22 a workpiece to be irradiated is being heated by the electron beam.

For varying the power in this arrangement it is now only required to rotate the cam disk 6. Because of the curved sector of the cam disk 6 the distance of the massive cathode 10 to the aperture anode 17 changes. Because of this variation of the field intensity the power of this electron gun 10 is being adapted to the individual requirements.

| Reference numbers in the drawing | |
|---|---|
| 1 | Vacuum chamber |
| 2. | Opening |
| 3 | Rod |
| 4 | Seal |
| 5 | Collar |
| 6 | Cam disk |
| 7 | Compression spring |
| 8 | Insulator |
| 9 | Rod |
| 10 | Massive cathode |
| 11 | Sliding contact |
| 12 | Contact bar |
| 13 | Insulator |
| 14 | Wire cathode |
| 15 | Connection contacts |
| 16 | Flexible conduit |
| 17 | Aperature anode |
| 18 | Beam generating chamber |
| 19 | Processing chamber |
| 20, 21 | Magnet arrangement |
| 22 | Processing location |
| 23 | Electron beam |

We claim:
1. Device for the generation of electron beams with a vacuum chamber, in which a massive cathode is arranged with a wire cathode located above it and an aperture anode below it, and below the aperture anode focusing and/or deflecting magnet arrangements are provided which direct an electron beam emitted by the massive cathode and accelerated by the aperture anode to a processing location, wherein the aperture anode (17) is rigid and the massive cathode (10) and the wire cathode (14) are axially movable in the vacuum chamber (1), following means of contact (11, 12) are provided leading outside the vacuum chamber (1) over the path of motion of the massive cathode (10) and the wire cathode (14), a means of motion (3) connected to the massive cathode (10) is provided for the axial movement of the massive cathode (10).

2. Device according to claim 1 wherein he means of motion (3) is movable along the center axis of the massive cathode (10) and is connected to the center of the massive cathode (10).

3. Device according to claim 1 wherein the means of motion (3) penetrates, sealed to the outside, the vacuum chamber (1).

4. Device according to the claim 1 wherein the means of motion (3) comprises an insulated rod (3), movable in the axial direction, which on one end supports the massive cathode (10) and on the other end, penetrating the vacuum chamber (1), is connected with a linear drive (6).

5. Device according to claim 1 wherein, an insulating body (8) is provided having at its lower side rods (9) at the lower end of which the massive cathode (10) is arranged, and which is connected at its upper side to the axially movable red(3), the rod (3) penetrates the vacuum chamber (1) to the outside, for the penetration of tho rod (3) sealing means (4) are provided, and the rod (3) attaches at its free end to a linear drive (6).

6. Device according to claim 5 wherein the rods (9) are provided with cathode voltage through contact arrangements (11, 12) when loading the massive cathode (10).

7. Device according to claim 5 wherein a cam disk (6) is provided with rotational drive and the rod (3) is pressed spring loaded against the cam disk (6).

8. Device according to claim 7 wherein the rod (3) has a collar (5), and a compression spring (7), which is being supported between the upper side of the vacuum chamber (1) and the collar (5), and which presses the rod (3) against the curved section of the cam disk (6).

9. Device according to claim 5 wherein outside of the vacuum chamber (1) a spindle-nut-drive is arranged as linear drive whereby the linearly movable part of the drive is connected non-rotationally with the rod (3).

10. Device according to claim 1 wherein spring loaded contacts (11), movable in a longitudinal direction and connected at least indirectly with the massive cathode (10), are in firm contact with contact bars (12) which are rigidly connected with the vacuum chamber (1).

11. Device according to claim 1 wherein in the vacuum chamber (1) fixed connecting elements (15) are arranged which are connected through flexible conduits (16) at least indirectly with the massive cathode (10; 14).

12. Device for the generation of electron beams with a vacuum chamber, in which a massive cathode is arranged with a wire cathode located above it and an aperture anode below it, and below the aperture anode focusing and/or deflecting magnet arrangements are provided which direct an electron beam emitted by the massive cathode and accelerated by the aperture anode to a processing location, wherein: the apperture anode is rigid and the massive cathode and the wire cathode are axially movable in the vacuum chamber;

following means of contact are provided leading outside the vacuum chamber over the path of motion of the massive cathode and the wire chathode;

a means of motion connected to the massive cathode is provided for the axial movement of the massive cathode;

wherein the means of motion is movable along the center axis of the massive cathode and is connected to the center of the massive cathode;

wherein the means of motion penetrates, sealed to the outside, the vacuum chamber;

wherein the means of motion comprises an insulated rod movable in axial direction which on one end supports the massive cathode and on the other end, penetrating the vacuum chamber, is connected with a linear drive;

wherein:

an insulating body is provided having at its lower side rods at the lower end of which the massive cathode is arranged, and which is connected at its upper side to the axially movable rod, the rod penetrates the vacuum chamber to the outside, for the penetration of the rod sealing means are provided, the rod attaches at its free end to a linear drive;

wherein the rods through contact arrangments are provided with cathode voltage when loading the massive cathode;

wherein a cam disk is provided with rotational drive and the rod is pressed spring loaded against the cam disk;

wherein the rod has a collar, and a compression spring, which is being supported between the upper side of the vacuum chamber and the collar, and which presses the rod against the curved section of the cam disk;

wherein outside of the vacuum chamber a spindle-nut-drive is arranged as linear drive whereby the linearly movable part of the drive is connected non-rotationally with the rod;

wherein spring loaded contacts, movable in a longitudinal direction and connected at least indirectly with the massive cathode, are in firm contact with contact bars which are rigidly connected with the vacuum chamber; and wherein in the vacuum chamber fixed connected elements are arranged which are connected through flexible conduits at least indirectly with the massive cathode.

* * * * *

UNITED STATES PATENT AND TRADEMARK OFFICE
CERTIFICATE OF CORRECTION

PATENT NO. : 5,623,148
DATED : April 22, 1997
INVENTOR(S) : Bernd-Dieter Wenzel et al.

It is certified that error appears in the above-identified patent and that said Letters Patent is hereby corrected as shown below:

Column 5, line 24 "red" should be --rod--.

Column 5, line 28 "tho" should be --the--.

Signed and Sealed this

Second Day of September, 1997

Attest:

BRUCE LEHMAN

*Attesting Officer*     *Commissioner of Patents and Trademarks*